United States Patent
Choi et al.

(10) Patent No.: US 9,692,359 B1
(45) Date of Patent: Jun. 27, 2017

(54) PULSE SHAPING BIASING CIRCUITRY

(71) Applicant: Qorvo US, Inc., Greensboro, NC (US)

(72) Inventors: Jinsung Choi, Greensboro, NC (US); Marcelo Jorge Franco, Summerfield, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/376,969

(22) Filed: Dec. 13, 2016

Related U.S. Application Data

(63) Continuation of application No. 15/065,312, filed on Mar. 9, 2016, now Pat. No. 9,520,837.

(51) Int. Cl.

| | |
|---|---|
| H03F 3/19 | (2006.01) |
| H03F 3/21 | (2006.01) |
| H04B 1/04 | (2006.01) |
| H03F 1/02 | (2006.01) |
| H03F 3/195 | (2006.01) |
| H03F 3/24 | (2006.01) |

(52) U.S. Cl.
CPC .......... *H03F 1/0222* (2013.01); *H03F 3/195* (2013.01); *H03F 3/245* (2013.01); *H04B 1/04* (2013.01); *H03F 2200/18* (2013.01); *H03F 2200/333* (2013.01); *H03F 2200/451* (2013.01); *H03F 2200/528* (2013.01); *H04B 2001/0408* (2013.01)

(58) Field of Classification Search
CPC .. H04B 1/034; H04B 1/04; H03F 1/02; H03F 1/32; H03F 3/19; H03F 3/21
See application file for complete search history.

(56) References Cited

U.S. PATENT DOCUMENTS

| | | | |
|---|---|---|---|
| 5,315,310 A * | 5/1994 | Eagle | ................. H04N 3/30 345/13 |
| 7,239,858 B2 * | 7/2007 | Bellantoni | ........... H04B 1/0458 455/277.1 |

(Continued)

OTHER PUBLICATIONS

Huang, Chun-Wen Paul et al., "A Highly Integrated Dual-band SiGe Power Amplifier that Enables 256 QAM 802.11ac WLAN Radio Front-End Designs," 2012 IEEE Radio Frequency Integrated Circuits Symposium Digest, Jun. 2012, IEEE, pp. 225-228.

(Continued)

*Primary Examiner* — Blane Jackson
(74) *Attorney, Agent, or Firm* — Withrow & Terranova, P.L.L.C.

(57) ABSTRACT

Pulse shaping biasing circuitry includes square wave generator circuitry, first inverse ramp signal generator circuitry, and second inverse ramp signal generator circuitry. The square wave generator circuitry is coupled between an input node and signal summation circuitry, and is configured to generate a square wave signal. The first inverse ramp signal generator circuitry is coupled in parallel with the square wave generator circuitry and configured to generate a first inverted ramp signal. The second inverse ramp signal generator circuitry is coupled in parallel with the square wave generator circuitry and the first inverse ramp signal generator circuitry and configured to generate a second inverted ramp signal. The square wave signal, the first inverted ramp signal, and the second inverted ramp signal are combined by the signal summation circuitry to provide a pulse shaping bias signal for a radio frequency (RF) power amplifier.

20 Claims, 16 Drawing Sheets

(56) References Cited

U.S. PATENT DOCUMENTS

| | | | |
|---|---|---|---|
| 9,160,283 B2* | 10/2015 | Choi | H03F 1/0261 |
| 9,520,837 B1 | 12/2016 | Choi et al. | |
| 2015/0035605 A1* | 2/2015 | Lam | H03F 3/19 |
| | | | 330/296 |
| 2015/0180518 A1* | 6/2015 | Whittaker | H03F 3/245 |
| | | | 455/127.2 |

OTHER PUBLICATIONS

Yoon, Sang-Woong, "Static and Dynamic Error Vector Magnitude Behavior of 2.4-GHz Power Amplifier," IEEE Transactions on Microwave Theory and Techniques, vol. 55, No. 4, Apr. 2007, pp. 643-647.

Notice of Allowance for U.S. Appl. No. 15/065,312, mailed Aug. 12, 2016, 7 pages.

* cited by examiner

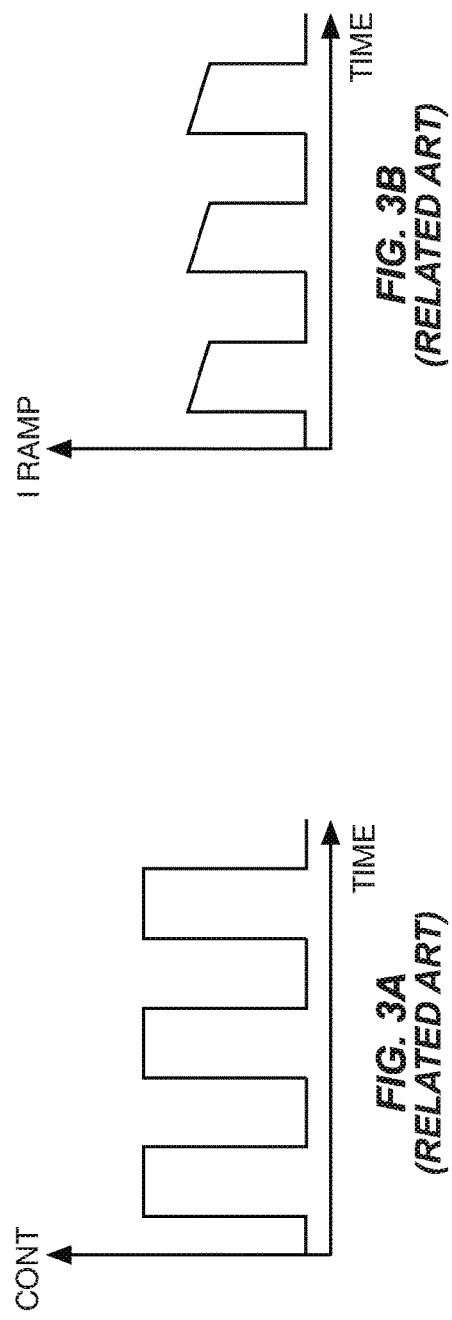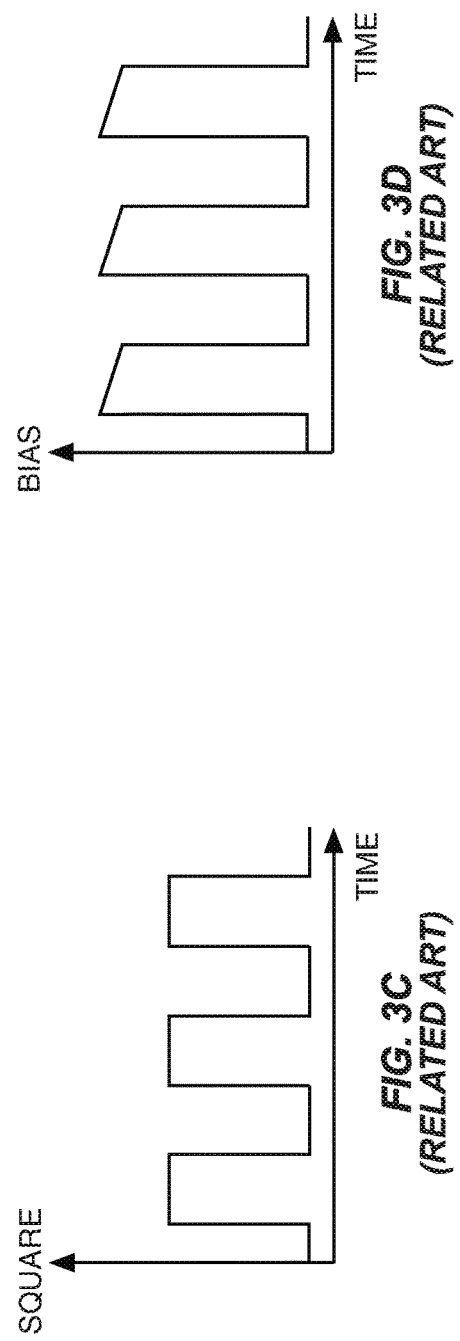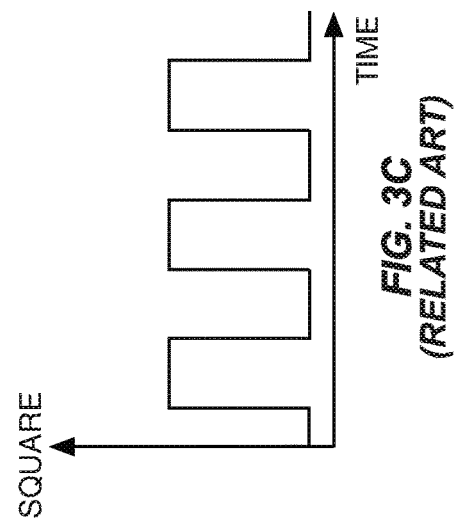

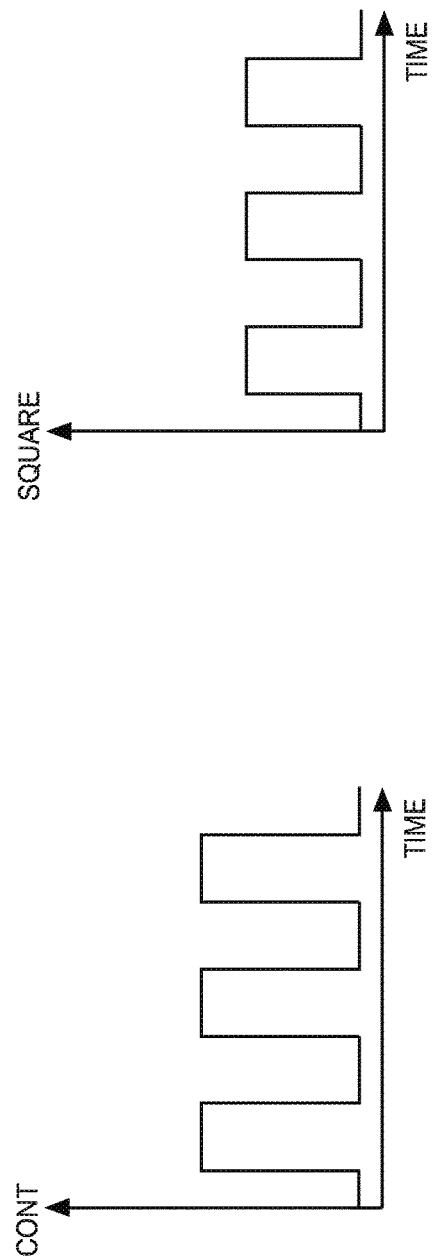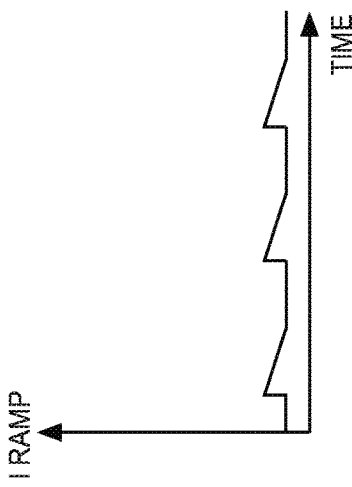

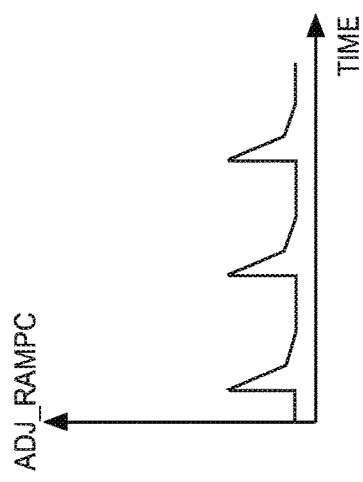

PULSE SHAPING BIASING CIRCUITRY

RELATED APPLICATIONS

This application is a continuation of U.S. patent application Ser. No. 15/065,312, filed Mar. 9, 2016, now U.S. Pat. No. 9,520,837, the disclosure of which is hereby incorporated herein by reference in its entirety.

FIELD OF THE DISCLOSURE

The present disclosure relates to biasing circuitry for a radio frequency power amplifier. Specifically, the present disclosure relates to biasing circuitry for maintaining a constant gain of a radio frequency power amplifier in a pulsed mode of operation.

BACKGROUND

Efficiency and battery life have become primary concerns of many mobile device manufacturers. Often, a large portion of the power consumed in a mobile device is due to the radio frequency (RF) power amplifiers used to transmit and receive signals from the device. Accordingly, by reducing the power consumption of the RF power amplifiers of a mobile device, the efficiency and battery life of a mobile device can be substantially improved.

One way to reduce the power consumption of an RF power amplifier is to operate the RF power amplifier in a pulsed mode of operation. In a pulsed mode of operation, an RF power amplifier is powered on and driven to a certain output level in order to amplify an RF signal, then shut down and placed in a state of low power consumption. Although effective for reducing the total amount of power consumed by the RF power amplifier, operating an RF power amplifier in a pulsed state of operation results in a non-linear gain function of the RF power amplifier with respect to the power-on time of the device. Specifically, as the RF power amplifier is powered on, the gain response of the RF power amplifier varies as the temperature of the internal components stabilizes. Due to the stringent wireless communications standards used by many mobile devices, the gain of the RF power amplifier generally does not have time to stabilize after it is powered on before amplification of a signal is required by the mobile device. The resulting gain variation of the RF power amplifier produces non-linear distortion that causes an increase in the error vector magnitude of the signal being amplified. An increased error vector magnitude of an amplified signal may negatively impact the performance and reliability of a mobile device in which the RF power amplifier is integrated.

FIG. 1 shows a graph 10 representing the gain of an RF power amplifier operated in a pulsed mode of operation with respect to the power-on time of the device. As shown by a trend line 12, the gain of the RF power amplifier is non-linear with respect to the power-on time of the device. Specifically, the gain of the device increases in a logarithmic fashion during a "warm up" period 14 of the RF power amplifier, as the internal components of the RF power amplifier stabilize. Accordingly, gain variation may be experienced by a signal amplified by the RF power amplifier.

In order to reduce the error vector magnitude of a signal amplified by an RF power amplifier operating in a pulsed mode of operation, a pulse shaping biasing signal may be applied to the RF power amplifier. FIG. 2 shows conventional pulse shaping biasing circuitry 16 for compensating an RF power amplifier operating in a pulsed mode of operation. For context, supplemental biasing circuitry 18 and an RF power amplifier 20 are also shown. The conventional pulse shaping biasing circuitry 16 includes an input node 22, an output node 24, a resistor-capacitor (RC) ramp signal generator 26 coupled between the input node 22 and the output node 24, and a biasing resistor 28 coupled in parallel with the RC ramp signal generator 26 between the input node 22 and the output node 24. The output node 24 of the conventional pulse shaping biasing circuitry 16 is coupled to the RF power amplifier 20 through the supplemental biasing circuitry 18.

In operation, the conventional pulse shaping biasing circuitry 16 receives a control signal CONT at the input node 22. The control signal CONT may be a square wave voltage, as shown in FIG. 3A. The control signal CONT is delivered to the RC ramp signal generator 26 and the biasing resistor 28. The RC ramp signal generator 26 includes a ramp resistor 30 and a ramp capacitor 32. As will be appreciated by those of ordinary skill in the art, as the control signal CONT is passed through the RC ramp signal generator 26, an inverted ramp signal RAMP is generated, as shown in FIG. 3B. As the control signal CONT is passed through the biasing resistor 28, the amplitude of the control signal CONT is adjusted to produce a square wave signal SQUARE, as shown in FIG. 3C. The inverted ramp signal RAMP and the square wave signal SQUARE are then combined to produce a pulse shaped biasing signal PS_BIAS, as shown in FIG. 3D, and delivered to the output node 24. The resulting pulse shaped biasing signal PS_BIAS can be used to compensate the RF power amplifier 20 for gain variations experienced as a result of operating in a pulsed mode of operation.

The pulse shaped biasing signal PS_BIAS is delivered from the conventional pulse shaping biasing circuitry 16 to the supplemental biasing circuitry 18, where the signal is amplified and subsequently delivered to the RF power amplifier 20. The RF power amplifier 20 includes an RF input terminal 34, an RF output terminal 36, and an amplifying transistor device 38. The amplifying transistor device 38 includes a collector contact C coupled to a supply voltage V_SUPP, a base contact B coupled to the supplemental biasing circuitry 18, and an emitter contact E coupled to ground. The RF input terminal 34 is coupled to the base contact B of the amplifying transistor device 38. The RF output terminal 36 is coupled to the collector contact C of the amplifying transistor device 38. The pulse shaped biasing signal PS_BIAS linearizes the gain response of the RF power amplifier 20 while operating in a pulsed mode of operation by delivering a pulse function that is opposite to the gain variation experienced by the RF power amplifier after being powered on. Specifically, the initial increase in amplitude of the pulse shaped biasing signal PS_BIAS compensates for the initially low gain response of the RF power amplifier 20 as it is powered on. As the gain response of the RF power amplifier 20 increases, the amplitude of the pulse shaped biasing signal PS_BIAS decreases in order to maintain the gain of the device at a constant value.

Although effective at linearizing the gain response and thus reducing the error vector magnitude of signals amplified by the RF power amplifier 20, the conventional pulse shaping biasing circuitry 16 requires relatively large component values to accomplish this task. Notably, the ramp resistor 30 of the conventional pulse shaping biasing circuitry 16 generally must be on the order of 2 kΩ and the ramp capacitor 32 generally must be on the order of 100 nF in order to achieve the appropriate inverted ramp signal RAMP while maintaining the square wave signal SQUARE at a level appropriate for biasing the RF power amplifier 20. The large component values required by the conventional pulse shaping biasing circuitry 16 may consume an unnecessary amount of power and occupy a large area in the circuitry in which they are integrated. Further, the required components are practically incapable of integration due to their size, thereby leading to inefficiencies in the connection and layout of the conventional pulse shaping biasing circuitry 16.

Accordingly, there is a need for biasing circuitry that is capable of stabilizing the gain response of an RF power amplifier operated in a pulsed mode of operation while offering improved efficiency for a mobile terminal in which it is incorporated.

SUMMARY

Pulse shaping biasing circuitry for a radio frequency (RF) power amplifier includes signal summation circuitry, a square wave signal generator, a first inverse ramp signal generator, and a second inverse ramp signal generator. The signal summation circuitry is configured to add one or more signals to provide a portion of a pulse-shaped bias signal for the RF power amplifier. The square wave signal generator is coupled between an input node and the signal summation circuitry and configured to generate a square wave signal. The first inverse ramp signal generator circuitry is coupled in parallel with the square wave signal generator circuitry between the input node and the signal summation circuitry and configured to generate a first inverted ramp signal having a first slope and a first duration. The second inverse ramp signal generator is coupled in parallel with the square wave signal generator circuitry and the first inverse ramp signal generator circuitry between the input node and the signal summation circuitry and configured to generate a second inverted ramp signal having a second slope and a second duration, wherein the first slope is different from the second slope and the first duration is different from the second duration. By using the first inverse ramp signal generator and the second inverse ramp signal generator along with the square wave generator, the largest magnitude of the first inverted ramp signal and the second inverted ramp signal required is reduced, thereby allowing for increased performance of the first inverted ramp signal generator and the second inverted ramp signal generator. Further, using both the first inverted ramp signal generator and the second inverted ramp signal generator allows for the creation of a pulse shaping bias signal with multiple different slopes, which may increase the accuracy of the response thereof.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIGS. 3A-3D show graphical representations of various signals in the conventional pulse shaping biasing circuitry.

FIGS. 5A through 5E show various signals in the pulse shaping biasing circuitry according to one embodiment of the present disclosure.

FIGS. 11A through 11C show various signals in the pulse shaping biasing circuitry according to one embodiment of the present disclosure.

DETAILED DESCRIPTION

Figure 1:
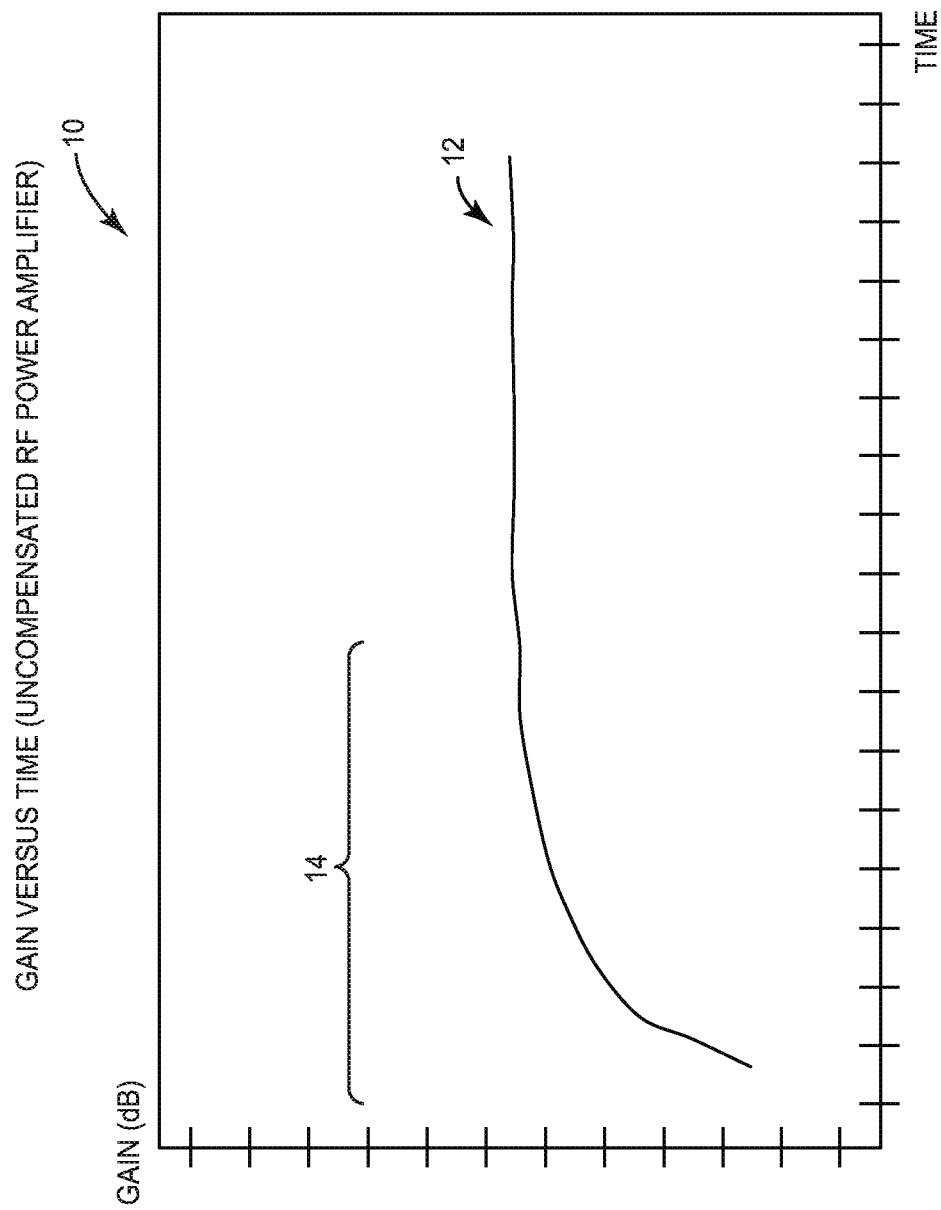
FIG. 1 is a graph representing the gain of an uncompensated RF power amplifier operated in a pulsed mode of operation with respect to the power on time of the device.
Figure 2:
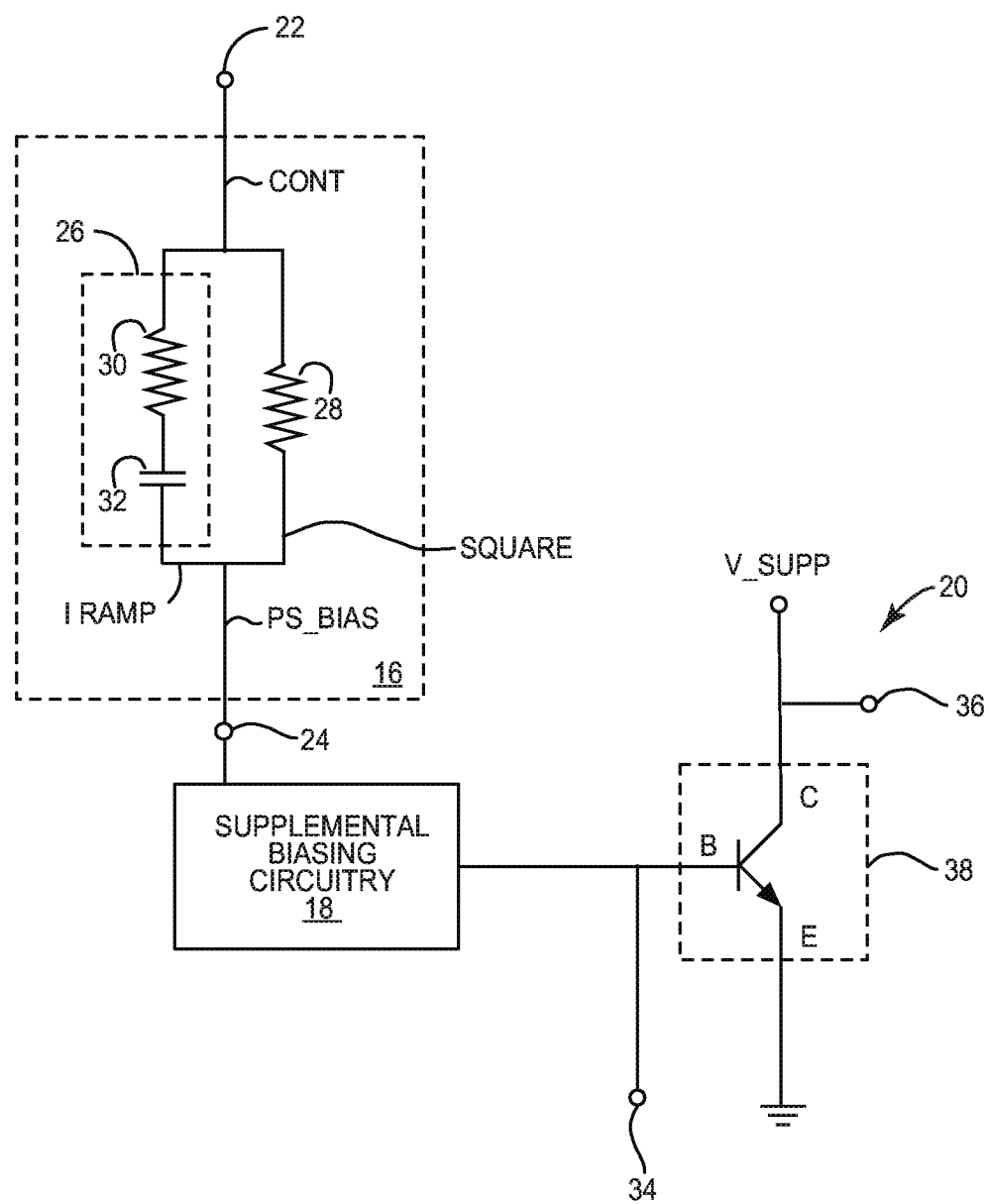
FIG. 2 is a schematic representation of conventional pulse shaping biasing circuitry.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 4:
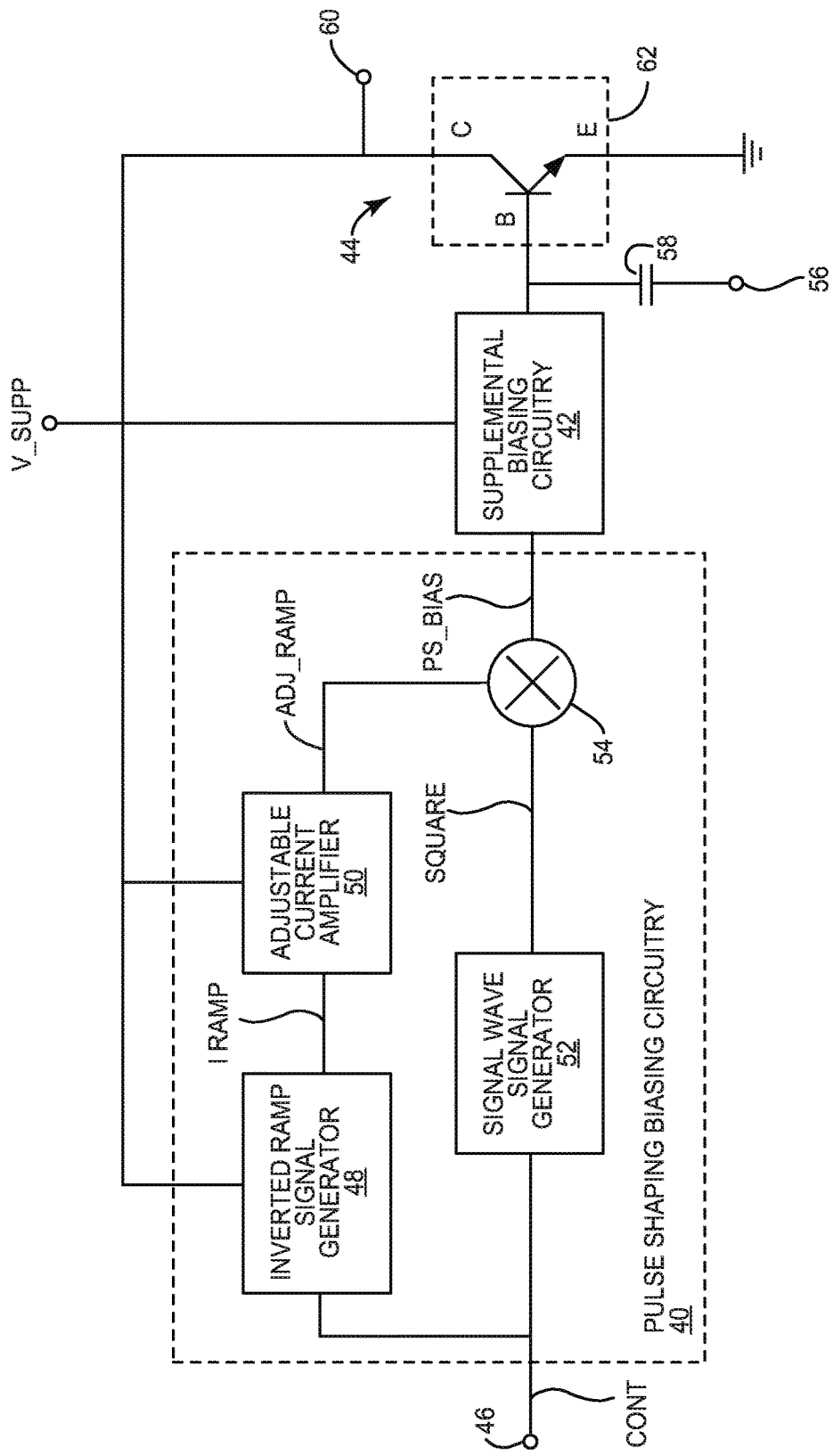
FIG. 4 shows pulse shaping biasing circuitry according to one embodiment of the present disclosure.

Turning now to FIG. 4, integrated pulse shaping biasing circuitry 40 is shown according to one embodiment of the present disclosure. For context, supplemental biasing circuitry 42 and an RF power amplifier 44 are also shown. The pulse shaping biasing circuitry 40 includes an input node 46, an inverted ramp signal generator 48, an adjustable current amplifier 50, a square wave signal generator 52, and signal summation circuitry 54. The inverted ramp signal generator 48 and the adjustable current amplifier 50 are coupled in series between the input node 46 and the signal summation circuitry 54. The square wave signal generator 52 is coupled in parallel with the inverted ramp signal generator 48 and the adjustable current amplifier 50 between the input node 46 and the signal summation circuitry 54. The pulse shaping biasing circuitry 40 may be coupled to the RF power amplifier 44 through the supplemental biasing circuitry 42.

Figure 5E:
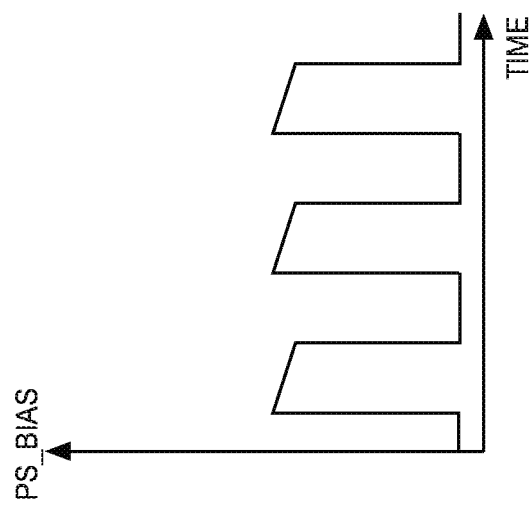
Figure 5D:
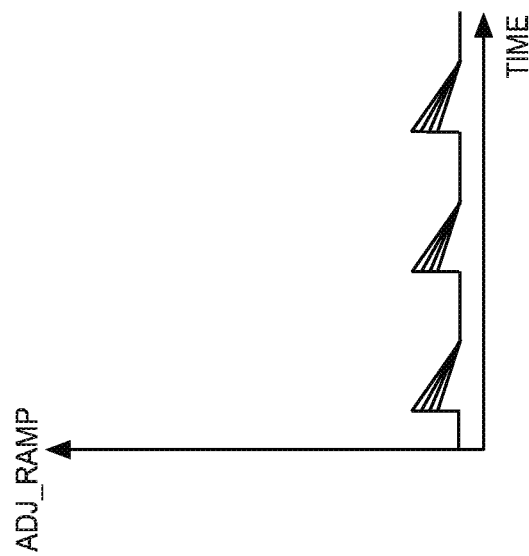

In operation, the pulse shaping biasing circuitry 40 receives a control signal CONT, which may be a square wave signal as shown in FIG. 5A. The control signal CONT is delivered to the inverted ramp signal generator 48 and the square wave signal generator 52. The square wave signal generator 52 uses the control signal CONT to produce a square wave signal SQUARE, as shown in FIG. 5B, which is delivered to the signal summation circuitry 54. The inverted ramp signal generator 48 uses the control signal CONT to produce an inverted ramp signal RAMP, as shown in FIG. 5C, which is then delivered to the adjustable current amplifier 50. Notably, as discussed in detail below, the inverted ramp signal generator 48 generates the inverted ramp signal based on a supply voltage V_SUPP provided to the RF power amplifier 44 and a temperature associated with the RF power amplifier 44 and/or the pulse shaping biasing circuitry 40 in order to reduce the error vector magnitude associated with the RF power amplifier 44 due to operation in a pulsed mode. As shown in FIG. 5C, the inverted ramp signal RAMP includes a step in signal amplitude, followed by a linear or non-linear decline. The adjustable current amplifier 50 adjusts the slope of the inverted ramp signal RAMP to produce an adjusted ramp signal ADJ_RAMP, as shown in FIG. 5D, and delivers the adjusted ramp signal ADJ_RAMP to the signal summation circuitry 54. The square wave signal SQUARE and the adjusted ramp signal ADJ_RAMP are then combined by the signal summation circuitry 54 to produce a pulse shaped biasing signal PS_BIAS, as shown in FIG. 5E.

The pulse shaped biasing signal PS_BIAS is delivered from the pulse shaping biasing circuitry 40 to the supplemental biasing circuitry 42, where it may be further amplified and delivered to the RF power amplifier 44, as discussed in further detail below. The RF power amplifier 44 may include an RF input terminal 56, an RF input capacitor 58, an RF output terminal 60, and an amplifying transistor device 62. The amplifying transistor device 62 may include a collector contact C coupled to a supply voltage V_SUPP, an emitter contact E coupled to a fixed voltage, and a base contact B coupled to the supplemental biasing circuitry 42. The RF input terminal 56 may be coupled to the base contact B of the amplifying transistor device 62 through the RF input capacitor 58. The RF output terminal 60 may be coupled to the collector contact C of the amplifying transistor device 62. When applied to the RF power amplifier 44, the pulse shaped biasing signal PS_BIAS quickly raises and stabilizes the temperature of the internal components of the RF power amplifier 44. In doing so, the pulse shaped biasing signal PS_BIAS allows for a linear gain response of the RF power amplifier 44 when the RF power amplifier 44 is operated in a pulsed state of operation.

As will be appreciated by those of ordinary skill in the art, the amplifying transistor device 62 may be a bipolar junction transistor (BJT), a field effect transistor (FET), a metal-oxide-semiconductor field-effect transistor (MOSFET), or the like.

The inverted ramp signal generator 48, the adjustable current amplifier 50, the square wave signal generator 52, and the signal summation circuitry 54 may be monolithically on a single semiconductor die 64, as discussed in further detail below. By integrating the inverted ramp signal generator 48, the adjustable current amplifier 50, the square wave signal generator 52, and the signal summation circuitry 54 on the single semiconductor die 64, the performance of the pulse shaping biasing circuitry 40 may be significantly improved. Further, the footprint of the pulse shaping biasing circuitry 40 is reduced, thereby saving space in a mobile terminal in which the pulse shaping biasing circuitry 40 is integrated.

Although the pulse shaping biasing circuitry 40 is described with respect to a mobile terminal above, those of ordinary skill in the art will appreciate that the principles of the present disclosure may be applied to any wireless device.

Figure 6A:
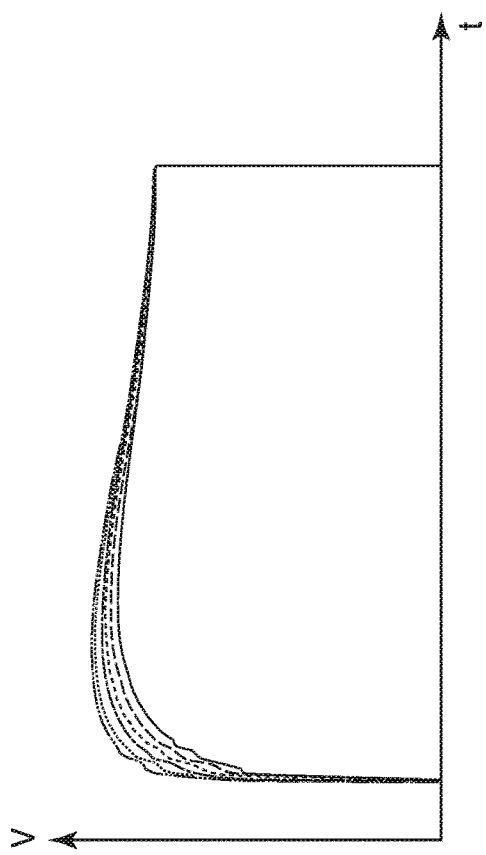
FIGS. 6A and 6B are graphs illustrating the dependence of a pulse shaped biasing signal from the pulse shaped biasing circuitry on supply voltage and temperature.
Figure 6B:
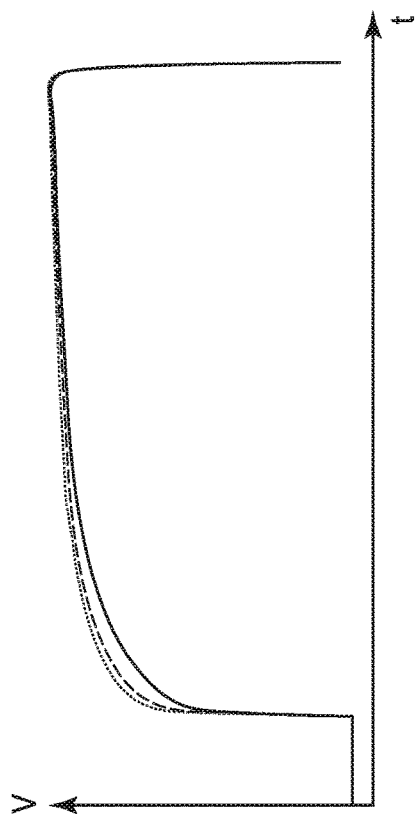

The shape of the pulse shaped biasing signal PS_BIAS may be dependent on both the supply voltage V_SUPP and temperature, as shown in FIGS. 6A and 6B. Specifically, FIG. 6A shows the dependence of the pulse shaped biasing signal PS_BIAS on the supply voltage V_SUPP, where each pulse curve is associated with a different supply voltage V_SUPP. FIG. 6B shows the dependence of the pulse shaped biasing signal PS_BIAS on temperature, where each pulse curve is associated with a different temperature. To avoid inconsistencies in the pulse shaping biasing circuitry 40, it may thus be necessary to compensate for changes in both the supply voltage V_SUPP and temperature. This may be accomplished in the inverted ramp signal generator 48.

Figure 7A:
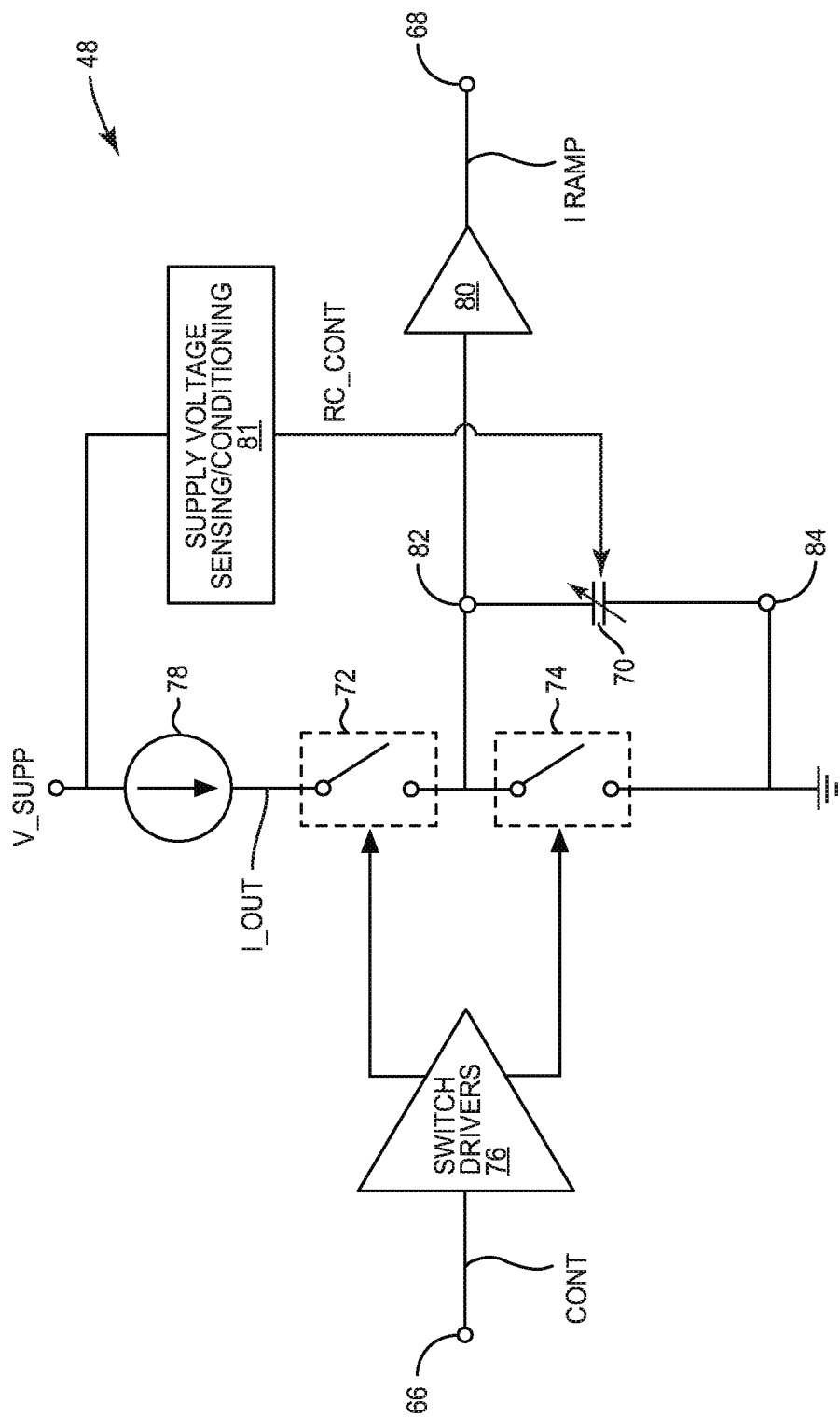
FIGS. 7A through 7C are schematic representations of the details of the inverted ramp signal generator shown in the pulse shaping biasing circuitry of FIG. 4 according to various embodiments of the present disclosure.

FIG. 7A thus shows details of the inverted ramp signal generator 48 according to one embodiment of the present disclosure. The inverted ramp signal generator 48 may include an input node 66, an output node 68, an adjustable ramp capacitance 70, a charging switch 72, a discharging switch 74, switch driver circuitry 76, a temperature-dependent current source 78, an inverting amplifier 80, and supply voltage sensing and conditioning circuitry 81. The adjustable ramp capacitance 70 may include a first terminal 82 coupled to the temperature-dependent current source 78 through the charging switch 72 and a second terminal 84 coupled to a fixed voltage. The discharging switch 74 may be coupled in parallel with the adjustable ramp capacitance 70 between the first terminal 82 and a fixed voltage. The switch driver circuitry 76 may be coupled to each one of the charging switch 72 and the discharging switch 74. The inverting amplifier 80 may be coupled between the first terminal 82 of the adjustable ramp capacitance 70 and the output node 68. The supply voltage sensing and conditioning circuitry 81 may be coupled between the supply voltage V_SUPP and the adjustable ramp capacitance 70.

In operation, the control signal CONT is received by the switch driver circuitry 76. The switch driver circuitry 76 uses the control signal CONT to drive the charging switch 72 and the discharging switch 74 so that they are 180 degrees out of phase with one another. Specifically, when the control signal CONT goes high, the charging switch 72 is closed and the discharging switch 74 is opened in order to begin charging the adjustable ramp capacitance 70. When the control signal CONT goes low, the charging switch 72 is opened and the discharging switch 74 is closed in order to discharge the adjustable ramp capacitance 70. Accordingly, the adjustable ramp capacitance 70 is continually charged by the temperature-dependent current source 78 through the charging switch 72, and then discharged by the discharging switch 74, thereby creating a ramp signal. The inverting amplifier 80 then inverts the ramp signal to produce the inverted ramp signal RAMP, as shown in FIG. 5C. By generating the inverted ramp signal RAMP in this way, the value of the adjustable ramp capacitance 70 can be kept low, typically on the order of 10 pF or less. The substantial savings in area gained by lowering the value of the adjustable ramp capacitance 70 allows the inverted ramp signal generator 48 to be on the single semiconductor die 64 with the adjustable current amplifier 50, the square wave signal generator 52, and the signal summation circuitry 54, thereby minimizing the footprint of the device. Further, using the inverted ramp signal generator 48 may result in reduced power consumption for the pulse shaping biasing circuitry 40 as compared to the conventional solutions.

The temperature-dependent current source 78 provides an output current I_OUT that is dependent on temperature. In one embodiment, the temperature-dependent current source 78 is physically oriented near the RF power amplifier 44 so that the output current I_OUT is dependent on the temperature of the RF power amplifier 44. In other embodiments, the temperature-dependent current source 78 is physically oriented near the other components of the pulse shaping biasing circuitry 40 so that the output current I_OUT is dependent on the temperature of the pulse shaping biasing circuitry 40. The temperature-dependent current source 78 may be one of any known current generator topologies that are dependent on temperature. For example, the temperature-dependent current source 78 may be a proportional to absolute temperature (PTAT) current source. The details of these temperature-dependent current sources will be appreciated by those of ordinary skill in the art, and thus are omitted from the present disclosure for purposes of brevity. As the temperature of the RF power amplifier 44 and/or the pulse shaping biasing circuitry 40 increases, the output current I_OUT of the temperature-dependent current source 78 will proportionally increase. This effectively increases the peak magnitude of the inverted ramp signal RAMP, which would otherwise be diminished due to increasing temperature as shown in FIG. 6B.

The adjustable ramp capacitance 70 may be any component having an adjustable capacitance. For example, the adjustable ramp capacitance 70 may be a varactor, a digitally programmable array of capacitors (DPAC), or any number of other well-known components that are capable of providing an adjustable capacitance. The supply voltage sensing and conditioning circuitry 81 receives the supply voltage V_SUPP and provides a ramp capacitance control signal RC_CONT to the adjustable ramp capacitance 70 in order to adjust the capacitance thereof. The ramp capacitance control signal RC_CONT may be an analog control signal or a digital control signal, and may be provided in any number of suitable ways based on the details of the adjustable ramp capacitance 70. The capacitance of the adjustable ramp capacitance 70 may increase in proportion to the supply voltage V_SUPP. Increasing the capacitance of the adjustable ramp capacitance 70 generally results in a slower charge rate thereof and a larger peak current value, or peak magnitude of the inverted ramp signal IRAMP. Since the peak magnitude of the inverted ramp signal diminishes as the supply voltage V_SUPP increases as shown in FIG. 6A, operating the inverted ramp signal generator 48 in this manner provides a consistent pulse shaped biasing signal PS_BIAS over changes in the supply voltage V_SUPP.

Figure 7B:
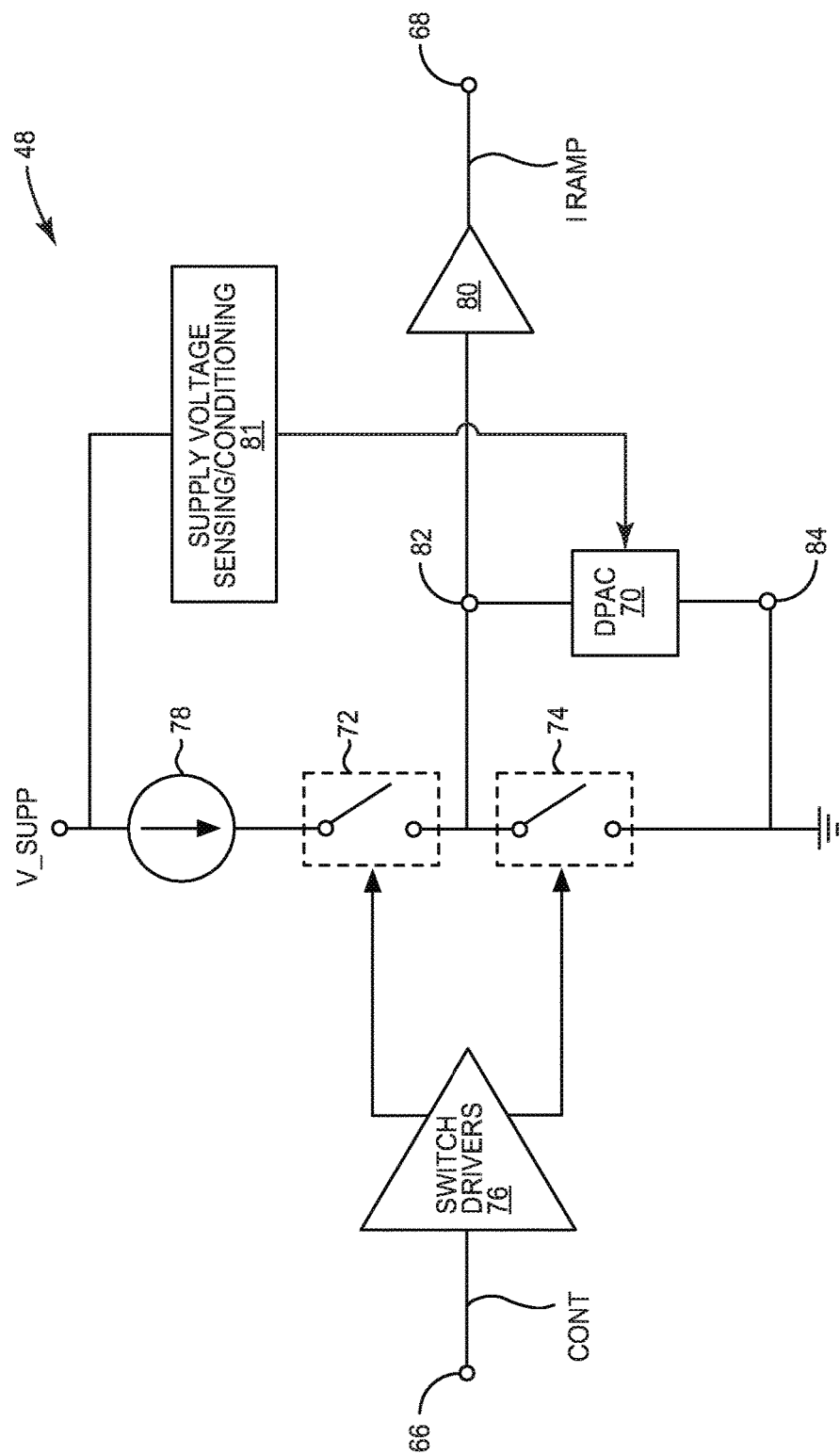

FIG. 7B shows details of the inverted ramp signal generator 48 according to an additional embodiment of the present disclosure. The inverted ramp signal generator 48 shown in FIG. 7B is similar to that shown in FIG. 7A, except that the adjustable ramp capacitance 70 is a DPAC, as discussed above. In such an embodiment, the capacitance of the adjustable ramp capacitance 70 may be selected between a number of predetermined values by a digital signal, which is provided by the supply voltage sensing and conditioning circuitry 81.

Figure 7C:
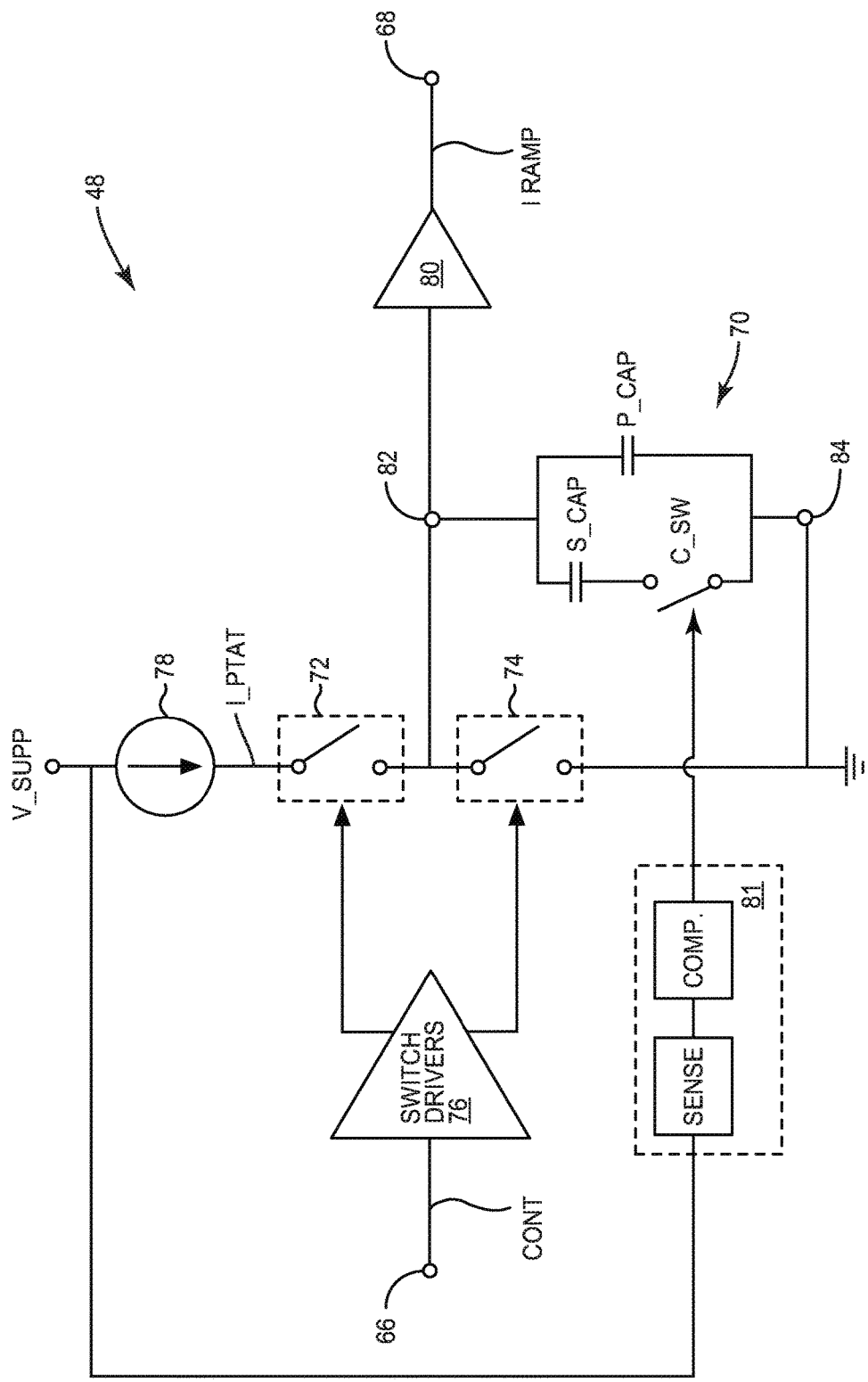

FIG. 7C shows details of the inverted ramp signal generator 48 according to an additional embodiment of the present disclosure. The inverted ramp signal generator 48 shown in FIG. 7C is similar to that shown in FIGS. 7A and 7B above, except that adjustable ramp capacitance 70 includes a primary capacitance P_CAP, a secondary capacitance S_CAP, and a capacitance switch C_SW. Further, the supply voltage sensing and conditioning circuitry 81 includes a supply voltage sensor S_VSUPP and a comparator COMP. The supply voltage sensor S_VSUPP provides a supply voltage V_SUPP measurement to the comparator COMP. When the supply voltage V_SUPP is above a predetermined threshold, it provides an output signal to the capacitance switch C_SW, which closes in response thereto. Accordingly, when the supply voltage V_SUPP is below the predetermined threshold of the comparator COMP, the primary capacitance P_CAP is provided between the first terminal 82 and the second terminal 84. When the supply voltage V_SUPP is above the predetermined threshold of the comparator COMP, the primary capacitance P_CAP and the secondary capacitance S_CAP are provided in parallel between the first terminal 82 and the second terminal 84. Since capacitances in parallel are additive, this results in a larger capacitance between the first terminal 82 and the second terminal 84 when the supply voltage V_SUPP is above the predetermined threshold of the comparator COMP, which compensates for drops in the peak magnitude of the inverted ramp signal RAMP as the supply voltage V_SUPP increases.

Figure 8:
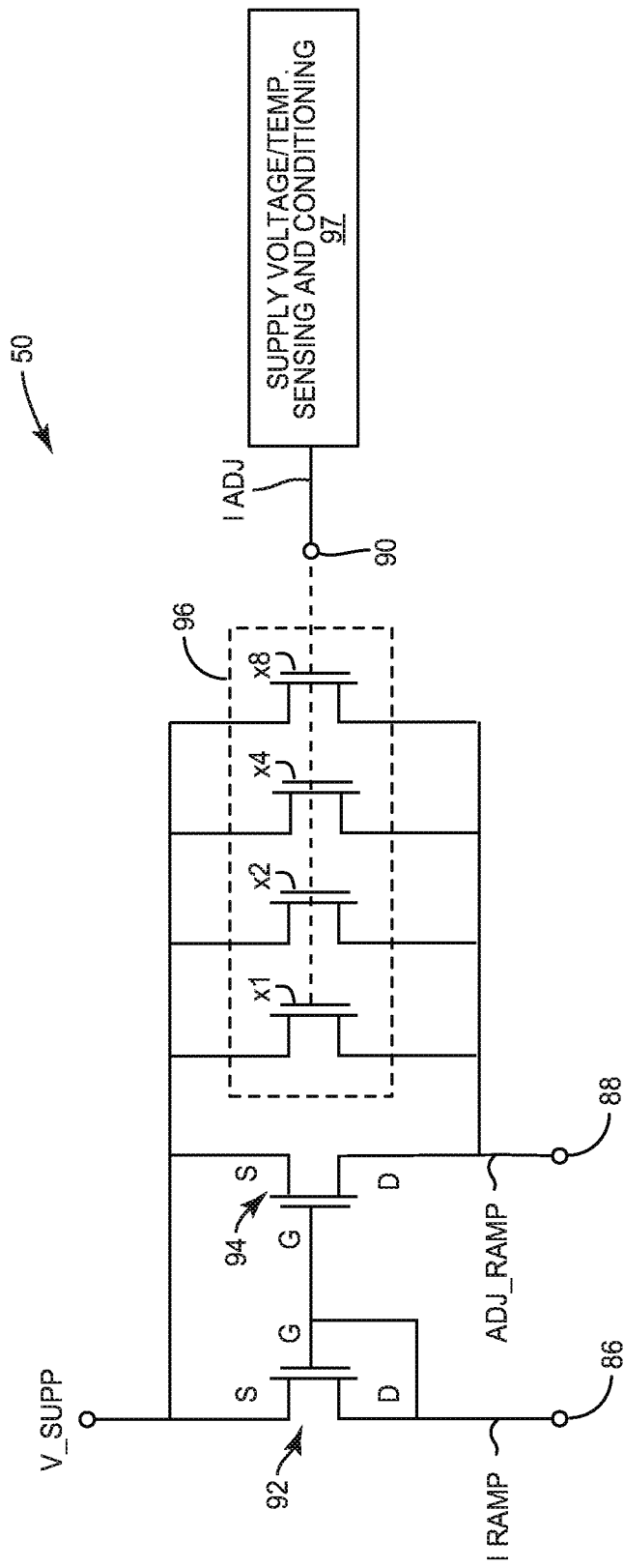
FIG. 8 is a schematic representation of the details of the adjustable current amplifier in the pulse shaping biasing circuitry of FIG. 4 according to one embodiment of the present disclosure.

In some embodiments, compensation of the pulse shaped biasing signal PS_BIAS due to the supply voltage V_SUPP and temperature is performed not only by the inverted ramp signal generator 48, but also by the adjustable current amplifier 50. Accordingly, FIG. 8 shows details of the adjustable current amplifier 50 according to one embodiment of the present disclosure. The adjustable current amplifier 50 may include an input node 86, an output node 88, a control node 90, a first amplifying transistor 92, a second amplifying transistor 94, a plurality of multiplying transistors 96, and supply voltage/temperature sensing and conditioning circuitry 97. The first amplifying transistor 92 and the second amplifying transistor 94 may be arranged in a current mirror configuration, wherein a gate contact G of the first amplifying transistor 92 is coupled to a gate contact G of the second amplifying transistor 94, a source contact S of the first amplifying transistor 92 and a source contact S of the second amplifying transistor 94 are coupled to the supply voltage V_SUPP, a drain contact D of the second amplifying transistor 94 is coupled to the output node 88, and a drain contact D of the first amplifying transistor 92 is coupled to the gate contact G of the first amplifying transistor 92, the gate contact G of the second amplifying transistor 94, and the input node 86. Each one of the plurality of multiplying transistors 96 may be coupled in parallel between the source contact S and the drain contact D of the second amplifying transistor 94. The control node 90 may be coupled between each one of the multiplying transistors 96 (either together or separately) and the supply voltage/temperature sensing and conditioning circuitry 97.

The first amplifying transistor 92 and the second amplifying transistor 94 may be, for example, metal-oxide-semiconductor field-effect transistors (MOSFETs), field-effect transistors (FETs), bipolar junction transistors (BJTs), or the like. Similarly, each one of the multiplying transistors 96 may comprise a transistor device such as a MOSFET, FET, BJT, or the like.

In operation, the adjustable current amplifier 50 receives the inverted ramp signal IRAMP at the input node 86 from the inverted ramp signal generator 48. The inverted ramp signal RAMP is then mirrored and amplified by the second amplifying transistor 94 to produce the adjusted ramp current signal ADJ_RAMP, and is subsequently delivered to the output node 88. A current adjust control signal IADJ provided by the supply voltage/temperature sensing and conditioning circuitry 97 determines which of the multiplying transistors 96 are saturated or conducting, thereby adjusting the gain of the current mirror formed between the first amplifying transistor 92 and the second amplifying transistor 94. Accordingly, the slope of the adjusted ramp current signal ADJ_RAMP may be adjusted based on the supply voltage V_SUPP, the temperature of the RF power amplifier 44 and/or the pulse shaping biasing circuitry 40, or any other parameter in order to better compensate the RF power amplifier 44 to linearize the gain response of the device. For example, the slope of the adjusted ramp current signal ADJ_RAMP may be increased in order to compensate for a slower increase in gain of the RF power amplifier 44 as the device is powered on. Such increase may be proportional to the supply voltage V_SUPP and/or temperature as discussed above.

Figure 9:
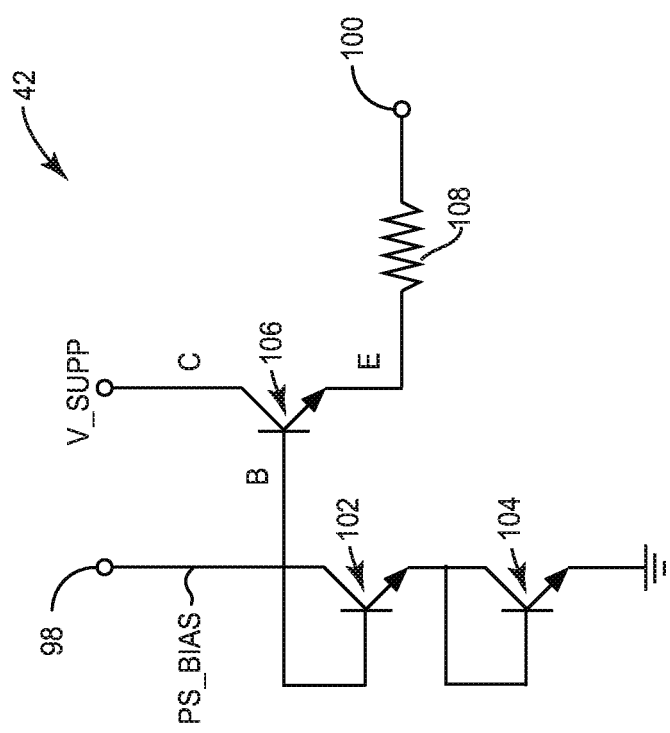
FIG. 9 is a schematic representation of the details of the supplementary biasing circuitry shown in FIG. 4 according to one embodiment of the present disclosure.

FIG. 9 shows details of the supplemental biasing circuitry 42 shown in FIG. 4 according to one embodiment of the present disclosure. The supplemental biasing circuitry 42 may include an input node 98, an output node 100, a first diode connected transistor 102, a second diode connected transistor 104, a biasing transistor 106, and a biasing resistor 108. The first diode connected transistor 102 and the second diode connected transistor 104 may be coupled in series between the input node 98 and a fixed voltage. The biasing transistor 106 may include a base contact B coupled to the input node 98, a collector contact C coupled to the supply voltage V_SUPP, and an emitter contact E coupled to the output node 100 through the biasing resistor 108.

The first diode connected transistor 102, the second diode connected transistor 104, and the biasing transistor 106 may be BJTs, FETs, MOSFETs, or the like.

In operation, the supplemental biasing circuitry 42 receives the pulse shaped biasing signal PS_BIAS at the input node 98 from the signal summation circuitry 54. The pulse shaped biasing signal PS_BIAS is then passed into the base contact B of the biasing transistor 106, where it is amplified and passed through the biasing resistor 108 to the RF power amplifier 44. The first diode connected transistor 102 and the second diode connected transistor 104 provide a voltage reference at the base contact B of the biasing transistor 106.

Although the supplemental biasing circuitry 42 is shown including the first diode connected transistor 102, the second diode connected transistor 104, the biasing transistor 106, and the biasing resistor 108, those of ordinary skill in the art will appreciate that the pulse shaping biasing circuitry 40 may be used with any supplemental biasing circuitry 42 capable of accepting current as a reference for providing a biasing signal to the RF power amplifier 44.

Figure 10:
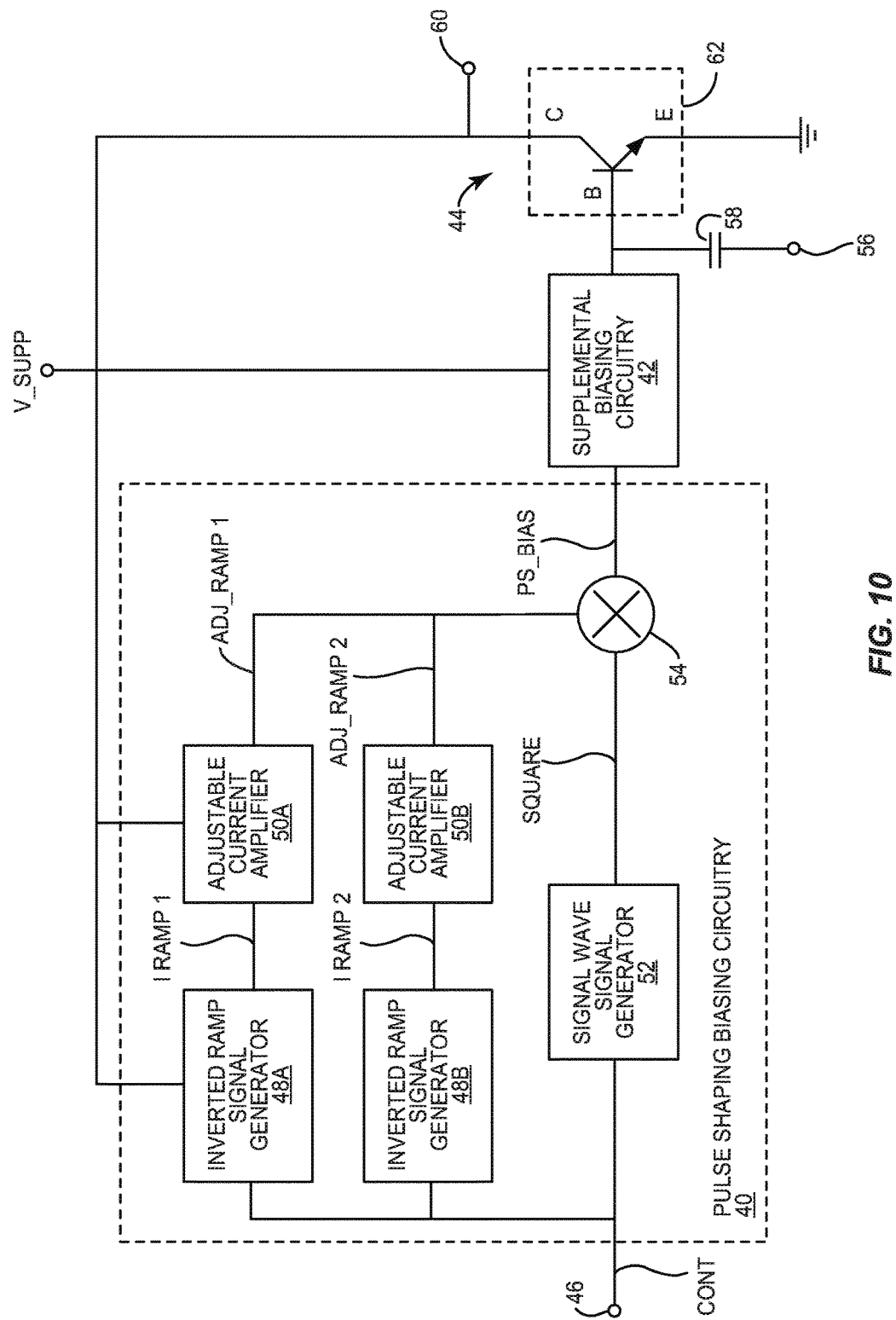
FIG. 10 shows pulse shaping biasing circuitry according to an additional embodiment of the present disclosure.

In some scenarios, it may be desirable to provide a pulse shaped biasing signal PS_BIAS with a non-constant slope. For example, it may be desirable to have a pulse shaped biasing signal PS_BIAS with a steep peak that swiftly declines, followed by a slower decline. Accordingly, FIG. 10 shows the pulse shaping biasing circuitry 40 according to an additional embodiment of the present disclosure. The pulse shaping biasing circuitry 40 shown in FIG. 10 is similar to that shown above in FIG. 4, except that the inverted ramp signal generator 48 and the adjustable current amplifier 50 are replaced with a first inverted ramp signal generator 48A and a first adjustable current amplifier 50A coupled in series between the input node 46 and the signal summation circuitry 54 and a second inverted ramp signal generator 48B and a second adjustable current amplifier 50B also coupled in series between the input node 46 and the signal summation circuitry 54 such that the first inverted ramp signal generator 48A and the first adjustable current amplifier 50A are coupled in parallel with the second inverted ramp signal generator 48B and the second adjustable current amplifier 50B.

The first inverted ramp signal generator 48A may generate a first inverted ramp signal IRAMP1, which is adjusted by the first adjustable current amplifier 50A to provide a first adjusted inverted ramp signal ADJ_RAMP1 having a high magnitude and a short duration, as shown in FIG. 11A. In particular, the capacitances in the first inverted ramp signal generator 48A may be particularly tailored to providing this high magnitude signal for a short duration. In contrast, the second inverted ramp signal generator 48B may generate a second inverted ramp signal IRAMP2, which is adjusted by the second adjustable current amplifier 50B to provide a second adjusted inverted ramp signal ADJ_RAMP2 having a low magnitude and a long duration, as shown in FIG. 11B. The high magnitude, short duration inverted ramp signal and the low magnitude, long duration inverted ramp signal may be combined by the signal summation circuitry as shown in FIG. 11C to generate a combined inverted ramp signal ADJ_RAMPC with two different slopes. Notably, any number of inverted ramp signal generators and adjustable current amplifiers may be provided to provide $3^{rd}$, $4^{th}$, and $n^{th}$ order compensation in order to better tailor the pulse shaped biasing signal PS_BIAS to compensate the RF power amplifier 44.

Figure 12:
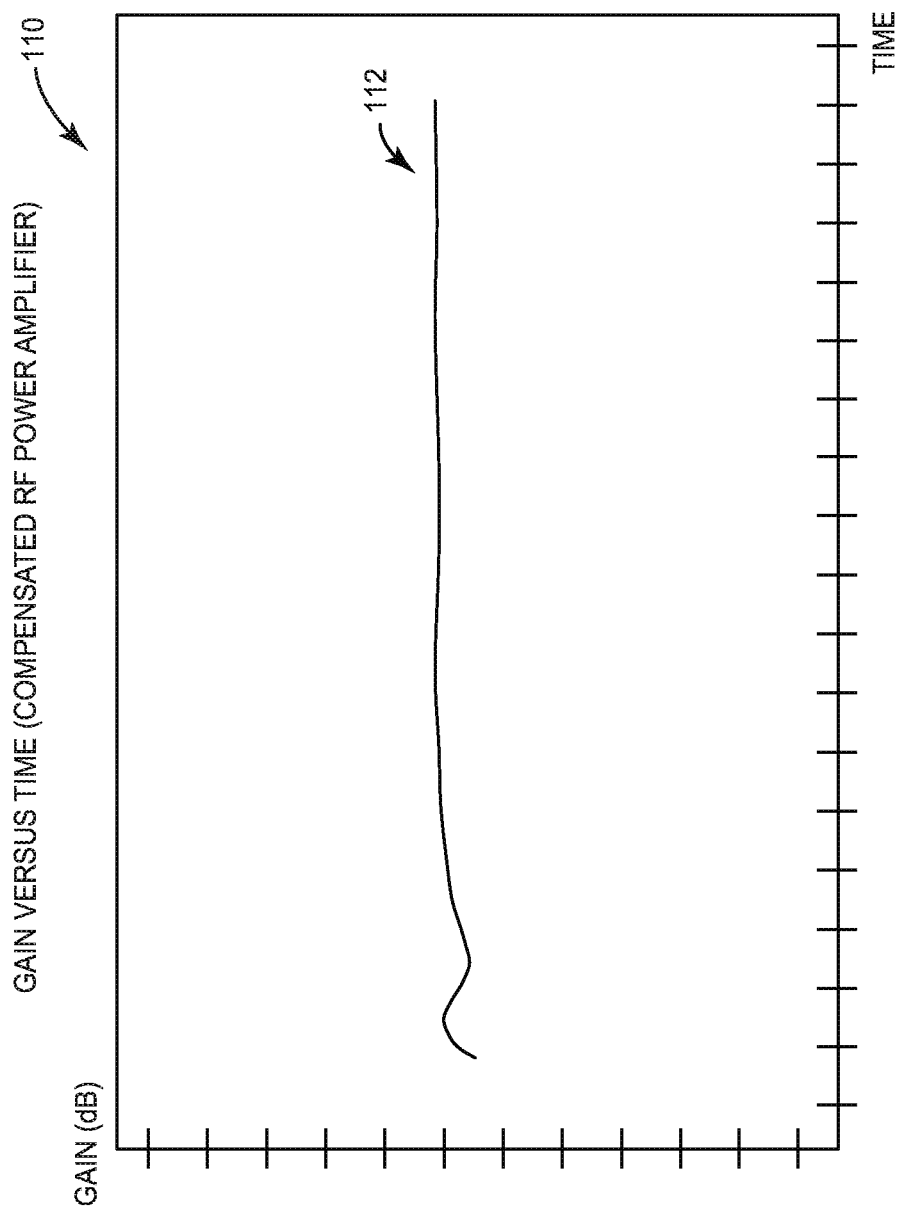
FIG. 12 is a graph representing the gain of an RF power amplifier compensated by the pulse shaping biasing circuitry shown in FIG. 4 and operated in a pulsed mode of operation with respect to the power on time of the device according to one embodiment of the present disclosure.

FIG. 12 shows a graph 110 representing the approximate gain with respect to the turn-on time of an RF power amplifier including the pulse shaping biasing circuitry 40 and operated in a pulsed mode of operation. As shown by the trend line 112, the gain of the RF power amplifier remains substantially constant over time, thereby resulting in improved performance and reliability of a mobile terminal in which the RF power amplifier and pulse shaping biasing circuitry are integrated. Notably, this trend will hold over changes in the supply voltage V_SUPP and temperature due to the compensation provided by the inverted ramp signal generator 48 and/or the adjustable current amplifier 50 discussed above. The compensation may result in improvements in output power of the RF power amplifier 44 between 3.0 dB and 10.0 dB, and specifically around 5.6 dB. This may result in an improvement in the error vector magnitude (EVM) of the RF power amplifier 44 between 1.0% and 5.0%, and specifically around 1.5%.

Figure 13:
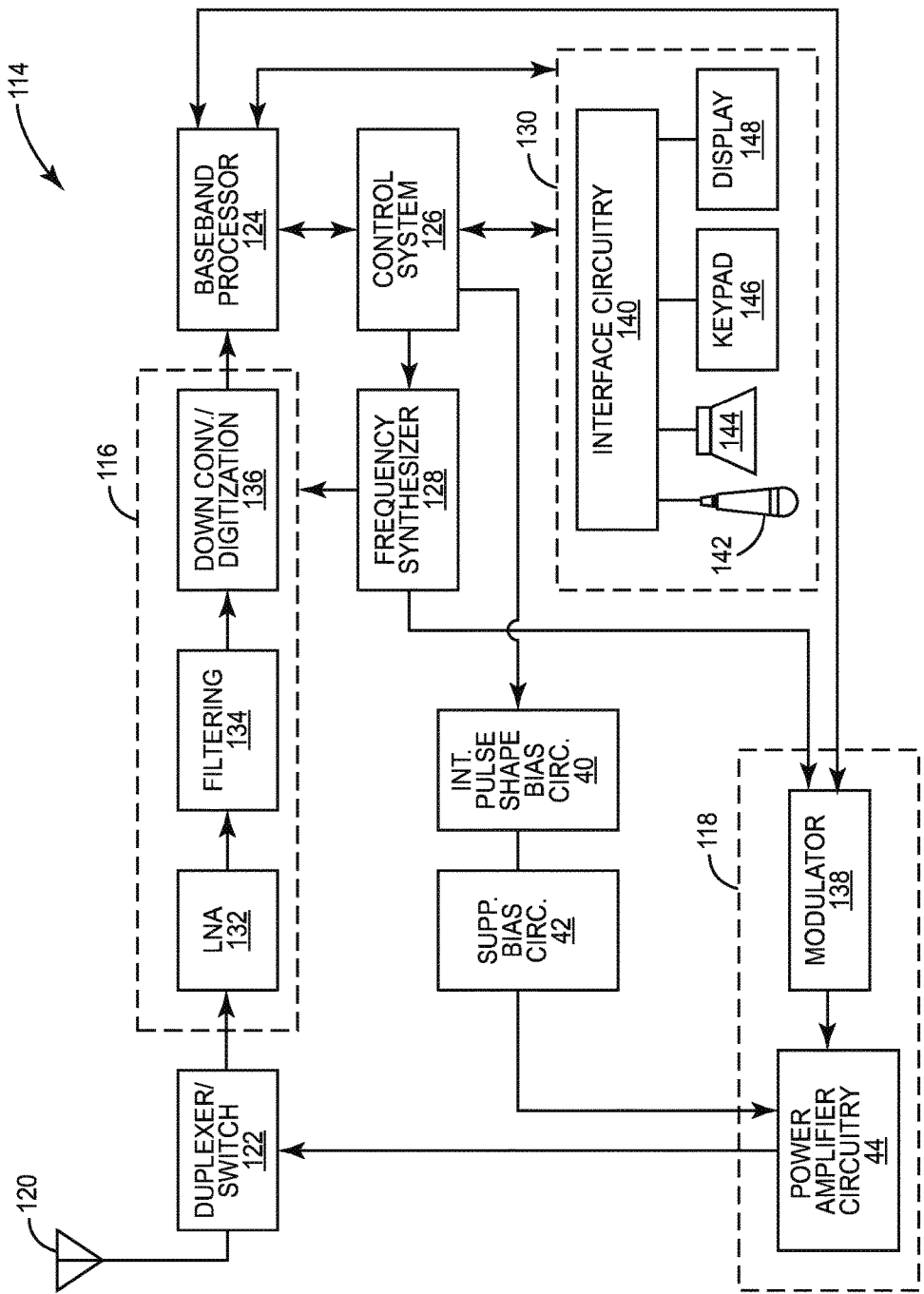
FIG. 13 is a schematic representation of a mobile terminal including the pulse shaping biasing circuitry of FIG. 4 according to one embodiment of the present disclosure.

One application of the pulse shaping biasing circuitry 40 shown above is in the radio frequency transmitter section of a mobile terminal 114, the basic architecture of which is represented in FIG. 13. The mobile terminal 114 may include a receiver front end 116, a radio frequency transmitter section 118, an antenna 120, a duplexer or switch 122, a baseband processor 124, a control system 126, a frequency synthesizer 128, and an interface 130. The receiver front end 116 receives an information bearing radio frequency signal from one or more remote transmitters provided by a base station (not shown). A low noise amplifier (LNA) 132 amplifies the signal. Filtering circuitry 134 minimizes broadband interference in the received signal, while down conversion and digitization circuitry 136 down converts the filtered, received signal to an intermediate or baseband frequency signal, which is then digitized into one or more digital streams. The receiver front end 116 typically uses one or more mixing frequencies generated by the frequency synthesizer 128. The baseband processor 124 processes the digitized received signal to extract the information or data bits conveyed in the signal. This processing typically comprises demodulation, decoding, and error correction operations. As such, the baseband processor 124 is typically implemented in one or more digital signal processors (DSPs).

On the transmit side, the baseband processor 124 receives digitized data, which may represent voice, data, or control information, from the control system 126, which it encodes for transmission. The encoded data is output to the radio frequency transmitter section 118, where it is used by a modulator 138 to modulate a carrier signal at a desired transmit frequency. The RF power amplifier 44 amplifies the modulated carrier signal to a level appropriate for transmission, and delivers the amplified and modulated carrier signal to the antenna 120 through the duplexer or switch 122. The pulse shaping biasing circuitry 40 and the supplemental biasing circuitry 42 provide a pulse shaped biasing signal to the RF power amplifier 44 in order to provide a linear gain response of the RF power amplifier 44 while in a pulsed mode of operation.

A user may interact with the mobile terminal 114 via the interface 130, which may include interface circuitry 140 associated with a microphone 142, a speaker 144, a keypad 146, and a display 148. The interface circuitry 140 typically includes analog-to-digital converters, digital-to-analog converters, amplifiers, and the like. Additionally, it may include a voice encoder/decoder, in which case it may communicate directly with the baseband processor 124. Audio information encoded in the received signal is recovered by the baseband processor 124, and converted by the interface circuitry 140 into an analog signal suitable for driving the speaker 144. The keypad 146 and the display 148 enable the user to interact with the mobile terminal 114. For example, the keypad 146 and the display 148 may enable the user to input numbers to be dialed, access address book information, or the like, as well as monitor call progress information.

Those skilled in the art will recognize improvements and modifications to the preferred embodiments of the present disclosure. All such improvements and modifications are considered within the scope of the concepts disclosed herein and the claims that follow.

What is claimed is:

1. Pulse shaping biasing circuitry for a radio frequency (RF) power amplifier comprising:
   signal summation circuitry configured to add one or more signals to provide at least a portion of a pulse-shaped bias signal for the RF power amplifier;
   a square wave signal generator coupled between an input node and the signal summation circuitry and configured to generate a square wave signal;
   first inverse ramp signal generator circuitry coupled in parallel with the square wave signal generator circuitry between the input node and the signal summation circuitry and configured to generate a first inverted ramp signal having a first slope and a first duration; and
   second inverse ramp signal generator circuitry coupled in parallel with the square wave signal generator circuitry and the first inverse ramp signal generator circuitry between the input node and the signal summation circuitry and configured to generate a second inverted ramp signal having a second slope and a second duration, wherein the first slope is different from the second slope and the first duration is different from the second duration.

2. The pulse shaping biasing circuitry of claim 1 wherein:
   the first inverse ramp signal generator is configured to generate the first inverse ramp signal based on a supply voltage provided to the RF power amplifier and a temperature; and
   the second inverse ramp signal generator is configured to generate the second inverse ramp signal based on the supply voltage provided to the RF power amplifier and the temperature.

3. The pulse shaping biasing circuitry of claim 2 wherein the temperature is associated with the RF power amplifier.

4. The pulse shaping biasing circuitry of claim 2 wherein the temperature is associated with the pulse shaping biasing circuitry.

5. The pulse shaping biasing circuitry of claim 2 further comprising:
a first adjustable current amplifier coupled in series between the first inverse ramp signal generator circuitry and the signal summation circuitry and configured to adjust the first slope of the first inverted ramp signal; and
a second adjustable current amplifier coupled in series between the second inverse signal generator circuitry and the signal summation circuitry and configured to adjust the second slope of the second inverted ramp signal.

6. The pulse shaping biasing circuitry of claim 5 wherein:
the first inverse ramp signal generator circuitry is configured to generate the first inverted ramp signal based on a magnitude of the supply voltage; and
the second inverse ramp signal generator circuitry is configured to generate the second inverted ramp signal based on the magnitude of the supply voltage.

7. The pulse shaping biasing circuitry of claim 5 wherein the first inverse ramp signal generator circuitry and the second inverse ramp signal generator circuitry each comprise:
a temperature-dependent current source;
an adjustable ramp capacitance including a first terminal and a second terminal coupled to a fixed voltage;
a charging switch coupled between the first terminal of the adjustable ramp capacitance and the temperature-dependent current source;
a discharging switch coupled in parallel between the first terminal and the second terminal of the adjustable ramp capacitance; and
an inverting amplifier coupled between the first terminal of the adjustable ramp capacitance and an output terminal.

8. The pulse shaping biasing circuitry of claim 7 wherein the adjustable ramp capacitance in the first inverse ramp signal generator circuitry is different from the adjustable ramp capacitance in the second inverse ramp signal generator circuitry.

9. The pulse shaping biasing circuitry of claim 7 wherein the adjustable ramp capacitance in the first inverse ramp signal generator circuitry and the adjustable ramp capacitance in the second inverse ramp signal generator circuitry are adjusted based on the magnitude of the supply voltage.

10. The pulse shaping biasing circuitry of claim 7 wherein the temperature dependent current source in the first inverse ramp signal generator circuitry and the temperature dependent current source in the second inverse ramp signal generator circuitry are proportional to absolute temperature (PTAT) current sources.

11. A radio frequency (RF) transmitter section for a mobile terminal comprising:
a modulator configured to receive a baseband signal and modulate the baseband signal at a desired carrier frequency;
RF power amplifier circuitry coupled to the modulator and configured to receive the baseband signal from the modulator and a supply voltage and amplify the baseband signal for transmission from an antenna; and
pulse shaping biasing circuitry coupled to the RF power amplifier circuitry, the pulse shaping biasing circuitry configured to linearize a gain response of the RF power amplifier circuitry and comprising:
signal summation circuitry configured to add one or more signals to provide at least a portion of a pulse-shaped bias signal for the RF power amplifier;
a square wave signal generator coupled between an input node and the signal summation circuitry and configured to generate a square wave signal;
first inverse ramp signal generator circuitry coupled in parallel with the square wave signal generator circuitry between the input node and the signal summation circuitry and configured to generate a first inverted ramp signal having a first slope and a first duration; and
second inverse ramp signal generator circuitry coupled in parallel with the square wave signal generator circuitry and the first inverse ramp signal generator circuitry between the input node and the signal summation circuitry and configured to generate a second inverted ramp signal having a second slope and a second duration, wherein the first slope is different from the second slope and the first duration is different from the second duration.

12. The RF transmitter section of claim 11 wherein:
the first inverse ramp signal generator is configured to generate the first inverse ramp signal based on a supply voltage provided to the RF power amplifier and a temperature; and
the second inverse ramp signal generator is configured to generate the second inverse ramp signal based on the supply voltage provided to the RF power amplifier and the temperature.

13. The RF transmitter section of claim 12 wherein the temperature is associated with the RF power amplifier.

14. The RF transmitter section of claim 12 wherein the temperature is associated with the pulse shaping biasing circuitry.

15. The RF transmitter section of claim 12 further comprising:
a first adjustable current amplifier coupled in series between the first inverse ramp signal generator circuitry and the signal summation circuitry and configured to adjust the first slope of the first inverted ramp signal; and
a second adjustable current amplifier coupled in series between the second inverse signal generator circuitry and the signal summation circuitry and configured to adjust the second slope of the second inverted ramp signal.

16. The RF transmitter section of claim 15 wherein:
the first inverse ramp signal generator circuitry is configured to generate the first inverted ramp signal based on a magnitude of the supply voltage; and
the second inverse ramp signal generator circuitry is configured to generate the second inverted ramp signal based on the magnitude of the supply voltage.

17. The RF transmitter section of claim 15 wherein the first inverse ramp signal generator circuitry and the second inverse ramp signal generator circuitry each comprise:
a temperature-dependent current source;
an adjustable ramp capacitance including a first terminal and a second terminal coupled to a fixed voltage;
a charging switch coupled between the first terminal of the adjustable ramp capacitance and the temperature-dependent current source;
a discharging switch coupled in parallel between the first terminal and the second terminal of the adjustable ramp capacitance; and
an inverting amplifier coupled between the first terminal of the adjustable ramp capacitance and an output terminal.

18. The RF transmitter section of claim 17 wherein the adjustable ramp capacitance in the first inverse ramp signal generator circuitry is different from the adjustable ramp capacitance in the second inverse ramp signal generator circuitry.

19. The RF transmitter section of claim 17 wherein the adjustable ramp capacitance in the first inverse ramp signal generator circuitry and the adjustable ramp capacitance in the second inverse ramp signal generator circuitry are adjusted based on the magnitude of the supply voltage.

20. The RF transmitter section of claim 17 wherein the temperature dependent current source in the first inverse ramp signal generator circuitry and the temperature dependent current source in the second inverse ramp signal generator circuitry are proportional to absolute temperature (PTAT) current sources.

* * * * *

UNITED STATES PATENT AND TRADEMARK OFFICE
CERTIFICATE OF CORRECTION

Page 1 of 1

PATENT NO. : 9,692,359 B1
APPLICATION NO. : 15/376969
DATED : June 27, 2017
INVENTOR(S) : Jinsung Choi et al.

It is certified that error appears in the above-identified patent and that said Letters Patent is hereby corrected as shown below:

In the Specification

In Column 2, Lines 21, 26 and 67, replace "RAMP" with --IRAMP--.

In Column 5, Line 67, replace "RAMP" with --IRAMP--.

In Column 6, Line 10, replace "RAMP" with --IRAMP--.

In Column 6, Line 13, replace "RAMP to produce" with --IRAMP to produce--.

In Column 7, Lines 47 and 48, replace "RAMP" with --IRAMP--.

In Column 8, Line 15, replace "RAMP" with --IRAMP--.

In Column 9, Lines 12 and 54, replace "RAMP" with --IRAMP--.

Signed and Sealed this
Fifteenth Day of August, 2017

Joseph Matal
*Performing the Functions and Duties of the*
*Under Secretary of Commerce for Intellectual Property and*
*Director of the United States Patent and Trademark Office*